United States Patent [19]

Tanabe et al.

[11] Patent Number: 5,795,702
[45] Date of Patent: Aug. 18, 1998

[54] PHOTORESIST STRIPPING LIQUID COMPOSITIONS AND A METHOD OF STRIPPING PHOTORESISTS USING THE SAME

[75] Inventors: Masahito Tanabe; Kazumasa Wakiya; Masakazu Kobayashi; Toshimasa Nakayama. all of Kanagawa-ken, Japan

[73] Assignee: Tokyo Ohka Kogyo Co, Ltd., Kanagawa-Ken, Japan

[21] Appl. No.: 717,778

[22] Filed: Sep. 24, 1996

[30] Foreign Application Priority Data

Sep. 29, 1995 [JP] Japan ..................... 7-276504

[51] Int. Cl.$^6$ ..................... G03C 5/00; C11D 9/04
[52] U.S. Cl. ..................... 430/331; 430/329; 430/256; 510/176
[58] Field of Search ..................... 430/256, 331, 430/329; 510/176

[56] References Cited

U.S. PATENT DOCUMENTS

| | | | |
|---|---|---|---|
| 4,617,251 | 10/1986 | Sizensky | 430/256 |
| 5,102,777 | 4/1992 | Lin et al. | 430/331 |
| 5,279,771 | 1/1994 | Lee | 252/548 |
| 5,334,332 | 8/1994 | Lee | 252/548 |
| 5,381,807 | 1/1995 | Lee | 134/2 |
| 5,419,779 | 5/1995 | Ward | 134/38 |
| 5,482,566 | 1/1996 | Lee | 134/42 |
| 5,561,105 | 10/1996 | Honda | 510/178 |
| 5,597,678 | 1/1997 | Honda et al. | 430/331 |

FOREIGN PATENT DOCUMENTS 07-271 057  10/1995  Japan .

*Primary Examiner*—Janet C. Baxter
*Assistant Examiner*—Rosemary Ashton
*Attorney, Agent, or Firm*—Wenderoth, Lind & Ponack, L.L.P.

[57] ABSTRACT

The improved photoresist stripping liquid composition comprises (a) 2–30 wt % of a hydroxylamine, (b) 2–35 wt % of water, (c) 2–20 wt % of an amine having an acid dissociation constant (pKa) of 7.5–13 in aqueous solution at 25° C., (d) 35–80 wt % of a water-soluble organic solvent and (e) 2–20 wt % of a corrosion inhibitor and the method using this composition are capable of not only efficient removal of modified photoresist films that have been formed by dry etching, ashing, ion implantation and other treatments under hostile conditions but also effective prevention of the corrosion that would otherwise occur in substrates irrespective of whether they are overlaid with Al or Al alloy layers or Ti layers.

18 Claims, No Drawings

PHOTORESIST STRIPPING LIQUID COMPOSITIONS AND A METHOD OF STRIPPING PHOTORESISTS USING THE SAME

BACKGROUND OF THE INVENTION

1. Field of the Invention

This invention relates to photoresist stripping liquid compositions and a method of stripping photoresists using the same. More particularly, the invention relates to photoresist stripping liquid compositions having sufficiently good stripping and corrosion-inhibiting capabilities to be suitably used in the fabrication of semiconductor devices such as ICs and LSIs or liquid-crystal panel devices. The invention also relates to a method of stripping photoresists using said liquid compositions.

2. Description of Relevant Art

Semiconductor devices such as ICs and LSIs, as well as liquid-crystal panel devices are fabricated by a process comprising the following basic steps: forming a metallic film or an insulating film such as a $SiO_2$ film onto a substrate by chemical vapor deposition or any other suitable techniques; applying a uniform photoresist layer over the metallic or insulating film; exposing the applied photoresist layer to light and developing the exposed layer to form a photoresist pattern; selectively etching the conductive metallic film or the insulating film through the patterned mask to form a fineline circuit; and removing the unwanted photoresist layer with a liquid stripper. The metallic film is typically formed of aluminum (Al), an aluminum alloy (Al alloy) such as aluminum-silicon (Al—Si) or aluminum—silicon—copper (Al—Si—Cu); titanium (Ti); or a titanium alloy (Ti alloy), such as titanium nitride (TiN) or a titanium-tungsten system (TiW). One or more of such metallic films are formed onto the substrate.

While various liquid compositions have previously been used to strip photoresist layers, the use of liquid systems incorporating alkanolamines was recently proposed (as in Unexamined Published Japanese Patent Applications Nos. 49,355/1987 and 208,043/1988). In the current fabrication process of semiconductor devices and liquid-crystal devices, dry etching, ashing, ion implantation and other post-treatments are applied to photoresist films, which then become modified in nature. With the recent increase in the strictness of the conditions for these post-treatments, the nature of the modified photoresist films tends to become inorganic than organic and, as a result, the liquid strippers using alkanolamines have turned out to be inadequate for the purpose of stripping the modified photoresist films.

More recently, liquid compositions containing hydroxylamines have been proposed as systems capable of more efficient stripping of photoresists. For example, Unexamined Published Japanese Patent Application No. 289,866/1992 describes a photoresist stripping liquid composition containing both hydroxylamines and alkanolamines, and Unexamined Published Japanese Patent Application No. 266,119/1994 describes a photoresist stripping liquid composition containing not only hydroxylamines and alkanolamines but also a chelatant (corrosion inhibitor) such as catechol.

These liquid compositions containing hydroxylamines have a greater ability to strip the modified photoresist films than the liquid strippers containing alkanolamines. However, they cause another problem in that substrates having deposited films of Al or Al alloys such as Al—Si and Al—Si—Cu, or Ti are corroded.

In order to prevent the corrosion of Al or Al alloys, such as Al—Si and Al—Si—Cu, chelatants, such as catechol, have conventionally been used since they exhibit corrosion inhibiting effects to some effect; however, their effectiveness has not been completely satisfactory.

The corrosion of Ti is peculiar to the liquid strippers containing hydroxylamines and, unlike the corrosion of Al and Al-alloys, cannot be prevented by using chelatants such as catechol.

The term "titanium (Ti)," as used herein, means "pure titanium" and shall not include titanium alloys, such as titanium nitride (TiN) and the titanium-tungsten system (TiW). As a matter of fact, the liquid stripper described in Unexamined Published Japanese Patent Application No. 266119/1994 is capable of preventing the corrosion of titanium alloys but not of pure titanium, which will suffer from progressive corrosion.

Under the circumstances, it has been desired to develop a liquid photoresist stripper that is capable of not only efficient removal of modified photoresist films but also effective prevention of the corrosion of substrates having films of Al or Al alloys or Ti formed thereon.

The present inventors conducted intensive studies with a view to meeting this need. As a result, they found that the need could be satisfied by incorporating a hydroxylamine, water, a specified amine, a water-soluble organic solvent and a corrosion inhibitor in specified proportions. The present invention has been accomplished on the basis of this finding.

SUMMARY OF THE INVENTION

An object, therefore, of the present invention is to provide a photoresist stripping liquid composition that retains the stripping capability of the conventional systems using hydroxylamines and which exhibits satisfactory anti-corrosion effects not only on substrates having Al or Al alloy films but also on substrates having a Ti film.

Another object of the invention is to provide a method of stripping photoresists using said liquid composition.

The first object of the invention can be attained by a photoresist stripping liquid composition comprising (a) 2–30 wt % of a hydroxylamine, (b) 2–35 wt % of water, (c) 2–20 wt % of an amine having an acid dissociation constant (pKa) of 7.5–13 in aqueous solution at 25° C., (d) 35–80 wt % of a water-soluble organic solvent and (e) 2–20 wt % of a corrosion inhibitor.

The second object of the invention can be attained by a method of stripping photoresists composition the steps of providing a photoresist layer onto a substrate having a titanium layer, exposing the applied photoresist layer to light through a mask pattern and developing said exposed photoresist layer to provide a photoresist pattern, and dry etching the substrate through said photoresist pattern followed by stripping away the unwanted photoresist which may or may not be a modified film, wherein the unwanted photoresist which may or may not be a modified film is stripped with a liquid composition comprising (a) 2–30 wt % of a hydroxylamine, (b) 2–35 wt % of water, (c) 2–20 wt % of an amine having an acid dissociation constant (pKa) of 7.5–13 in aqueous solution at 25° C., (d) 35–80 wt % of a water-soluble organic solvent and (e) 2–20 wt % of a corrosion inhibitor.

DETAILED DESCRIPTION OF THE INVENTION

The hydroxylamine used as component (a) of the liquid stripper according to the first aspect of the invention is represented by the following general formula (I):

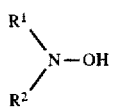

were $R^1$ and $R^2$ each independently a hydrogen atom or a lower alkyl group having 1–6 carbon atoms.

The lower alkyl group having 1–6 carbon atoms may be exemplified by methyl, ethyl, propyl, isopropyl, butyl, isobutyl, sec-butyl, tert-butyl, pentyl, isopentyl, neopentyl, tert-pentyl, hexyl, isohexyl, 3-methylpentyl, 2,2-dimethylbutyl and 2,3-dimethylbutyl. In the formula (I), $R^1$ and $R^2$ may be the same as or different from each other.

Specific examples of the hydroxylamine as component (a) include hydroxylamine ($NH_2OH$), N-methylhydroxylamine, N,N-dimethylhydroxylamine and N,N-diethylhydroxylamine, among which hydroxylamine ($NH_2OH$) is preferred. These hydroxylamines may be used either independently or in combination with themselves.

Water as component (b) is an inevitable part of component (a) but it may be intentionally added to adjust the water content to a desired level.

The amine as component (c) is such that it has an acid dissociation constant (pKa) of 7.5–13 in aqueous solution at 25° C. If the acid dissociation constant (pKa) of component (c) is less than 7.5, there will be no advantage for preventing the corrosion of Ti; if the pKa value exceeds 13, corrosion occurs in Al and Al alloys. Specific examples of the amine suitable as component (c) include: alkanolamines, such as monoethanolamine, diethanolamine, triethanolamine, 2-(2-aminoethoxy) ethanol, N,N-dimethylethanolamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine and triisopropanolamine; polyalkylenepolyamines, such as diethylenetriamine, triethylenetetramine, propylenediamine, N,N-diethylethylenediamine, N,N'-diethylethylenediamine, 1,4-butanediamine, N-ethylethylenediamine, 1,2-propanediamine, 1,3-propanediamine and 1,6-hexanediamine; aliphatic amines, such as 2-ethylhexylamine, dioctylamine, tributylamine, tripropylamine, triallylamine, heptylamine and cyclohexylamine; aromatic amines, such as benzylamine and diphenylamine; and cyclic amines, such as piperazine, N-methylpiperazine, methylpiperazine and hydroxyethylpiperazine. Among these amines, those having pKa values of 8.5–11.5 are preferred from the viewpoint of corrosion inhibition and particularly preferred are monoethanolamine, 2-(2-aminoethoxy)ethanol, diethylenetriamine, triethylenetetramine, cyclohexylamine and piperazine. Stripping operations may sometimes involve heating, so in order to ensure the safety of liquid photoresist strippers, the flash point of the amines to be used should preferably be at least 30° C., more preferably at least 50° C. Considering these factors together with the stability of the liquid stripper composition during continued use, triethylenetetramine is the most preferred as component (c).

The water-soluble organic solvent as component (d) may be any organic solvent that is miscible with water and those water-soluble organic solvents which are incorporated in conventional organic amine containing liquid strippers may be employed without any particular limitations. Examples of such water-soluble organic solvents include: sulfoxides, such as dimethyl sulfoxide; sulfones, such as dimethylsulfone, diethylsulfone, bis(2-hydroxyethyl) sulfone and tetramethylenesulfone; amides, such as N,N-dimethylformamide, N-methylformamide, N,N-dimethylacetamide, N-methylacetamide and N,N-diethylacetamide; lactams such as N-methyl-2-pyrrolidone, N-ethyl-2-pyrrolidone, N-propyl-2-pyrrolidone, N-hydroxymethyl-2-pyrrolidone and N-hydroxyethyl-2-pyrrolidone; imidazolidinones, such as 1,3-dimethyl-2-imidazolidinone, 1,3-diethyl-2-imidazolidinone and 1,3-diisoproypl-2-imidazolidinone; and polyols and their derivatives, such as ethylene glycol, ethylene glycol monomethyl ether, ethylene glycol monoethyl ether, ethylene glycol monobutyl ether, etheylene glycol monomethyl ether acetate, ethylene glycol monoethyl ether acetate, diethylene glycol, diethylene glycol monomethyl ether, diethylene glycol monoethyl ether and diethylene glycol monobutyl ether. These water-soluble organic solvents may be used either independently or in combination with themselves. Among these compounds, dimethyl sulfoxide, N,N-dimethylformamide, N,N-dimethylacetamide, N-methyl-2-pyrrolidone, 1,3-dimethyl-2-imidazolidinone and diethylene glycol monobutyl ether are preferred in view of their great ability to strip modified photoresist films. Dimethyl sulfoxide is the most preferred since it also exhibits outstanding anti-corrosion effects on substrates.

The corrosion inhibitor as component (e) may be selected from among any compounds that are used as corrosion inhibitors in the conventional liquid strippers containing organic amines. The preferred corrosion inhibitor is at least one compound selected from the group consisting of aromatic hydroxy compounds, acetylenic alcohols, carboxyl group containing organic compounds and anhydrides thereof, and triazole compounds.

Exemplary aromatic hydroxy compounds include phenol, cresol, xylenol, pyrocatechol, resorcinol, hydroquinone, pyrogallol, 1,2,4-benzenetriol, salicyl alcohol, p-hydroxybenzyl alcohol, o-hydroxybenzyl alcohol, p-hydroxyphenethyl alcohol, p-aminophenol, m-aminophenol, diaminophenol, aminoresorcinol, p-hydroxybenzoic acid, o-hydroxybenzoic acid, 2,4-dihydroxybenzoic acid, 2,5-dihydroxybenzoic acid, 3,4-dihydroxybenzoic acid and 3,5-dihydroxybenzoic acid. Among these, pyrocatechol is preferred. These compounds may be used either independently or in combination with themselves.

Exemplary acetylenic alcohols include 2-butyne-1,4-diol, 3,5-dimethyl-1-hexyn-3-ol, 2-methyl-3-butyn-2-ol, 3-methyl-1-pentyn-3-ol, 3,6-dimethyl-4-octyn-3,6-diol, 2,4,7,9-tetramethyl-5-decyne-4,7-diol and 2,5-dimethyl-3-hexyne-2,5-diol. Among these, 2-butyne-1, 4-diol is preferred. These acetylenic alcohols may be used either independently or in combination with themselves.

Exemplary carboxyl group containing organic compounds and anhydrides thereof include formic acid, acetic acid, propionic acid, butyric acid, isobutyric acid, oxalic acid, malonic acid, succininc acid, glutaric acid, maleic acid, fumaric acid, benzoic acid, phthalic acid, 1,2,3-benzenetricarboxylic acid, glycolic acid, lactic acid, malic acid, citric acid, acetic anhydride, phthalic anhydride, maleic anhydride, succinic anhydride and salicylic acid. Among these, formic acid, phthalic acid, benzoic acid, phthalic anhydride and salicylic acid are preferred, with phthalic acid, phthalic anhydride and salicylic acid being particularly preferred. These compounds may be used either independently or in combination with themselves.

Exemplary triazole compounds include benzotriazole, o-tolyltriazole, m-tolyltriazole, p-tolyltriazole, carboxybenzotriazole, 1-hydroxybenzotriazole, nitrobenzotriazole and dihydroxypropylbenzotriazole. Among these, benzotriazole is preferred. These compounds may be used either independently or in combination with themselves.

The corrosion inhibitors may be used either alone or in appropriate combinations depending upon various factors including the photoresist compositions used, stripping conditions, the conditions for the formation of modified photoresist films by treatments, such as ashing, ion implantation and plasma treatment, and the conditions for rinsing which is performed as a post-treatment. Aromatic hydroxy compounds are preferred and pyrocatechol is particularly preferred.

Components (a)–(e) are incorporated in the following proportions: 2–30 wt %, preferably 5–20 wt %, of component (a); 2–35 wt %, preferably 5–25 wt %, of component (b); 2–20 wt %, preferably 5–15 wt %, of component (c); 35–80 wt %, preferably 40–70 wt %, of component (d); and 2–20 wt %, preferably 3–10 wt %, of component (e). The relative proportions of components (a)–(e) are critical to the purposes of the present invention; if any one of the components fails to satisfy the quantitative requirement set forth above, no sufficient protection is ensured against the corrosion of both substrate types, one being coated with Al or Al alloy and the other coated with Ti; in addition, the ability to strip modified photoresist films is deteriorated.

The photoresist stripping liquid composition of the invention can advantageously be used with both negative- and positive-working photoresists that are developable with aqueous alkali solutions. Applicable photoresists include, but are not limited to: (i) positive-working photoresists containing naphthoquinone diazide compounds and novolac resins; (ii) positive-working photoresists containing compounds that generate acids upon exposure to light, compounds that are decomposed with acids to become more soluble in aqueous alkali solutions, and alkali-soluble resins; (iii) positive-working photoresists containing compounds that generate acids upon exposure to light and alkali-soluble resins containing groups that are decomposed with acids to become more soluble in aqueous alkali solutions; and (iv) negative-working photoresists containing compounds that generate acids upon exposure to light, crosslinking agents and alkali-soluble resins.

The method of stripping photoresists according to the second aspect of the present invention comprises the following steps: applying either one of the photoresists listed above onto a substrate having a titanium layer to provide a photoresists layer; exposing the applied photoresist layer to light through a mask pattern and developing the exposed photoresist layer in the usual manner to form a photoresist pattern; dry etching the subtrate through the photoresist pattern by a known procedure; optionally performing another modification treatment such as ashing or ion implantation; and finally contacting the substrate with the photoresist stripping liquid composition of the invention by suitable means such as immersion, thereby stripping the unwanted photoresist which may or may not be a modified film.

The following examples are provided for the purpose of further illustrating the present invention but are by no means intended to limit the same.

EXAMPLES 1–7

A silicon wafer (substrate) was successively coated with a Ti layer and an Al—Si layer which, in turn, was spin coated with THMR-iP3300 (product of Tokyo Ohka Kogyo Co., Ltd.) which was a positive-working photoresist comprising a naphthoquinone diazide compound and a novolac resin. The applied coating was prebaked at 90° C. for 90 sec to form a photoresist layer in a thickness of 2.0μm. The photoresist layer was exposed to light through a mask pattern using NSR-2005i10D (product of Nikon Corp.) and subsequently developed with an aqueous solution of 2.38 wt % tetramethylammonium hydroxide (TMAH) to form a photoresist pattern, which was post-baked at 120° C. for 90 sec.

The silicon wafer having the thus formed photoresist pattern was etched in the usual manner and the photoresist pattern was subjected to plasma-assisted ashing, yielding the residue from the ashing operation.

The thus treated silicon wafer was stripped of the photoresist film by being immersed in a liquid stripper (see Table 1 for its composition) at 65° C. for 20 min. The substrate was then rinsed with pure water and the strippability of the residue from the ashing of the silicon wafer (i.e., the strippability of the modified photoresist film), as well as the state of corrosion in the Ti and Al—Si layers were evaluated by examination with a SEM (scanning electron microscope). The results are shown in Table 1.

The criteria for evaluation of the strippability of the modified photoresist film were as follows: ○, good; X, incomplete stripping.

The state of corrosion was evaluated by the following criteria: ○, no corrosion; Δ, some corrosion; X, extensive corrosion.

TABLE 1

| Example No. | Composition of Liquid Photoresist Stripper (wt %) | | | | | Strippability of modified photoresist film | State of corrosion | |
|---|---|---|---|---|---|---|---|---|
| | (a) | (b) | (c) | (d) | (e) | | Al—Si | Ti |
| 1 | hydroxylamine (15) | (15) | monoethanolamine (10) pKa = 9.52 | DMSO (55) | pyrocatechol (5) | ○ | ○ | ○ |
| 2 | hydroxylamine (20) | (20) | diethylenetriamine (10) pKa = 9.84 | DMSO (40) | pyrocatechol (10) | ○ | ○ | ○ |
| 3 | hydroxylamine (20) | (20) | triethylenetetramine (10) pKa = 9.74 | DMSO (45) | pyrocatechol (10) | ○ | ○ | ○ |
| 4 | hydroxylamine (10) | (20) | cyclohexylamine (10) pKa = 9.83 | DMSO (55) | pyrocatechol (5) | ○ | ○ | ○ |
| 5 | hydroxylamine (15) | (15) | piperazine (5) | DMI (55) | pyrocatechol (5) | ○ | Δ | ○ |

TABLE 1-continued

| Example No. | Composition of Liquid Photoresist Stripper (wt %) | | | | | Strippability of modified photoresist film | State of corrosion | |
|---|---|---|---|---|---|---|---|---|
| | (a) | (b) | (c) | (d) | (e) | | Al—Si | Ti |
| 6 | hydroxylamine (5) | (20) | triethylenetetramine (10) pKa = 9.71 | NMP (59) | BDA (5) pyrocatechol (5) | ○ | Δ | ○ |
| 7 | hydroxylamine (15) | (15) | 2-(2-aminoethoxy)ethanol (13) pKa = 9.42 | butyl carbitol (50) | BT (1) pyrocatechol (2) salicylic acid (5) pKa = 9.74 | ○ | Δ | ○ |

Note:
DMSO, dimethyl sulfoxide; DMI, dimethylimidazolidinone; NMP, N-methyl-2-pyrrolidone; BDA, 2-butyne-1,4-diol; BT, benzotriazole

COMPARATIVE EXAMPLES 1–6

The strippability of the modified photoresist film and the state of corroof Ti and Al—Si layers were evaluated as in Example 1, except that the composition of the liquid stripper was changed to those shown in Table 2.

TABLE 2

| Comparative Example No. | Composition of Liquid Photoresist Stripper (wt %) | | | | | Strippability of modified photoresist film | State of corrosion | |
|---|---|---|---|---|---|---|---|---|
| | | | | | | | Al—Si | Ti |
| 1 | hydroxylamine (17.5) | water (17.5) | 2-(2-aminoethoxy)ethanol (27) pKa = 9.42 | DMSO (33) | pyrocatechol (5) | ○ | × | × |
| 2 | hydroxylamine (17) | water (17) | TMAH aq. (7) pKa = 14 | NMP (54) | pyrocatechol (5) | ○ | × | ○ |
| 3 | hydroxylamine (15) | water (15) | — | DMSO (65) | pyrocatechol (5) | ○ | ○ | × |
| 4 | hydroxylamine (20) | water (20) | diethylenetriamine (10) pKa = 9.84 | NMP (50) | — | ○ | × | ○ |
| 5 | — | water (20) | monoethanolamine (20) pKa = 9.52 | DMSO (50) | pyrocatechol (10) | × | ○ | ○ |
| 6 | hydroxylamine (20) | water (20) | 2-(2-aminoethoxy)ethanol (0.5) pKa = 9.42 | DMSO (54.5) | pyrocatechol (5) | ○ | ○ | × |

Note:
DMSO, dimethyl sulfoxide; NMP, N-methyl-2-pyrrolidone; TMAH aq., 75% aqueous solution of tetramethylammonium hydroxide As described above, the photoresist stripping liquid composition of the present invention is capable of not only efficient removal of modified photoresist films that have been formed by dry etching, ashing, ion implantation and other treatments under hostile conditions and effective preonvention of the corrosion that would otherwise occur in substrates irrespective of whether they are overlaid with Al or Al alloy layers or Ti layers. The invention also provides a method for stripping photoresists using this improved liquid composition.

What is claimed is:

1. A photoresist stripping liquid composition comprising (a) 2–30 wt % of a hydroxylamine, (b) 2–35 wt % of water, (c) 2–20 wt % of an amine having an acid dissociation constant (pKa) of 7.5–13 in aqueous solution at 25° C., (d) 35–80 wt % of a water-soluble organic solvent and (e) 2–20 wt % of a corrosion inhibitor.

2. A composition according to claim 1, wherein component (a) is hydroxylamine (NH$_2$OH).

3. A composition according to claim 1, wherein component (c) has an acid dissociation constant (pKa) of 8.5–11.5.

4. A composition according to claim 1, wherein component (c) is at least one member of the group consisting of monoethanolamine, 2-(2-aminoethoxy)ethanol, diethylenetriamine, triethylenetetramine, cyclohexylamine and piperazine.

5. A composition according to claim 4, wherein component (c) is triethylenetetramine.

6. A composition according to claim 1, wherein component (d) is at least one member of the group consisting of dimethyl sulfoxide, dimethylimidazolidinone, N-methyl-2-pyrrolidone and butyl carbitol.

7. A composition according to claim 6, wherein component (d) is dimethyl sulfoxide.

8. A composition according to claim 1, wherein component (e) is at least one member of the group consisting of pyrocatechol, 2-butyne-1,4-diol, benzotriazole and salicylic acid.

9. A composition according to claim 8, wherein component (e) is pyrocatechol.

10. In a method of stripping photoresists comprising the steps of providing a photoresist layer on a substrate having a titanium, aluminum, or aluminum alloy layer, exposing the applied photoresist layer to light through a mask pattern and developing said exposed photoresist layer to provide a photoresist pattern, and dry etching the substrate through said photoresist pattern followed by stripping away the unwanted photoresist which may or may not be a modified film, the improvement wherein the unwanted photoresist which may or may not be a modified film is stripped with a liquid composition comprising (a) 2–30 wt % of a hydroxylamine, (b) 2–35 wt % of water, (c) 2–20 wt % of an amine having an acid dissociation constant (pKa) of 7.5–13 in aqueous solution at 25° C., (d) 35–80 wt % of a water-soluble organic solvent and (e) 2–20 wt % of a corrosion inhibitor.

11. A method according to claim 10, wherein component (a) is hydroxylamine ($NH_2OH$).

12. A method according to claim 10, wherein component (c) has an acid dissociation constant (pKa) of 8.5–11.5.

13. A method according to claim 10, wherein component (c) is at least one member of the group consisting of monoethanolamine, 2-(2-aminoethoxy)ethanol, diethylenetriamine, triethylenetetramine, cyclohexylamine and piperazine.

14. A method according to claim 13, wherein component (c) is triethylenetetramine.

15. A method according to claim 10, wherein component (d) is at least one member of the group consisting of dimethyl sulfoxide, dimethylimidazolidinone, N-methyl-2-pyrrolidone and butyl carbitol.

16. A method according to claim 15, wherein component (d) is dimethyl sulfoxide.

17. A method according to claim 10, wherein component (e) is at least one member of the group consisting of pyrocatechol, 2-butyne-1,4-diol, benzotriazole and salicylic acid.

18. A method according to claim 17, wherein component (e) is pyrocatechol.

* * * * *